US011024891B2

(12) United States Patent
Riemer et al.

(10) Patent No.: US 11,024,891 B2
(45) Date of Patent: Jun. 1, 2021

(54) REUSABLE BATTERY INDICATOR WITH LOCK AND KEY MECHANISM

(71) Applicant: DURACELL U.S. OPERATIONS, INC., Wilmington, DE (US)

(72) Inventors: Joern Riemer, Santa Clara, CA (US); Robert Pavlinsky, Oxford, CT (US); Jordan Bourilkov, Bethany, CT (US); Steven J. Specht, Brookfield, CT (US); George Turco, Wilmington, DE (US); Sergio Coronado, Bethel, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 1218 days.

(21) Appl. No.: 15/340,773

(22) Filed: Nov. 1, 2016

(65) Prior Publication Data

US 2018/0123176 A1 May 3, 2018

(51) Int. Cl.
*H02J 7/00* (2006.01)
*H01M 10/42* (2006.01)
(Continued)

(52) U.S. Cl.
CPC ........ *H01M 10/425* (2013.01); *G01R 31/371* (2019.01); *G01R 31/3835* (2019.01);
(Continued)

(58) Field of Classification Search
USPC ................................................. 320/137, 149
See application file for complete search history.

(56) References Cited

U.S. PATENT DOCUMENTS

| 3,354,565 A | 11/1967 | Emmons et al. |
| 3,992,228 A | 11/1976 | Depoix |

(Continued)

FOREIGN PATENT DOCUMENTS

| CN | 1084281 A | 3/1994 |
| CN | 1163020 A | 10/1997 |

(Continued)

OTHER PUBLICATIONS

International Preliminary Report on Patentability (IPRP) for International Appl. No. PCT/US2017/059469, dated Feb. 13, 2019.
(Continued)

*Primary Examiner* — Brian Ngo
(74) *Attorney, Agent, or Firm* — Marshall, Gerstein & Borun LLP (57) ABSTRACT

A reusable battery indicator includes a voltage sensor configured to convert sensed analog characteristics of a battery to digital information; a communication circuit communicatively connected to the voltage sensor; an antenna operatively coupled to the communication circuit; and a connection mechanism having at least a first connector and a second connector that are electrically connected to the voltage sensor, the first connector and the second connector being adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal. One or more of the first connector and the second connector include part of a mechanical lock and key assembly.

30 Claims, 7 Drawing Sheets

(51) Int. Cl.
  *G01R 31/371* (2019.01)
  *G01R 31/3835* (2019.01)
  *H01M 50/543* (2021.01)
  *H01M 10/48* (2006.01)

(52) U.S. Cl.
  CPC ....... *H01M 10/4285* (2013.01); *H01M 10/48* (2013.01); *H01M 50/543* (2021.01); *H01M 2010/4278* (2013.01)

(56) References Cited

U.S. PATENT DOCUMENTS

| | | |
|---|---|---|
| 3,993,985 A | 11/1976 | Chopard et al. |
| 4,117,475 A | 9/1978 | Ebihara et al. |
| 4,149,146 A | 4/1979 | Ebihara et al. |
| 4,238,554 A | 12/1980 | Barrella |
| 4,302,751 A | 11/1981 | Nakauchi et al. |
| 4,460,870 A | 7/1984 | Finger |
| 4,482,615 A | 11/1984 | Rosansky et al. |
| 4,598,243 A | 7/1986 | Kawakami |
| 4,654,280 A | 3/1987 | Bailey |
| 4,759,765 A | 7/1988 | Van Kampen |
| 4,808,497 A | 2/1989 | Blomgren et al. |
| 4,860,185 A | 8/1989 | Brewer et al. |
| 4,952,330 A | 8/1990 | Leger et al. |
| 5,015,544 A | 5/1991 | Burroughs et al. |
| 5,032,825 A | 7/1991 | Kuznicki |
| 5,188,231 A | 2/1993 | Kivell et al. |
| 5,200,686 A | 4/1993 | Lee |
| 5,219,683 A | 6/1993 | Webber |
| 5,231,356 A * | 7/1993 | Parker .................. G01D 7/005 324/435 |
| 5,250,905 A | 10/1993 | Kuo et al. |
| 5,290,414 A | 3/1994 | Marple |
| 5,339,024 A | 8/1994 | Kuo et al. |
| 5,355,089 A | 10/1994 | Treger |
| 5,366,832 A | 11/1994 | Hayashi et al. |
| 5,389,458 A | 2/1995 | Weiss et al. |
| 5,389,470 A | 2/1995 | Parker et al. |
| 5,396,177 A | 3/1995 | Kuo et al. |
| 5,418,086 A | 5/1995 | Bailey |
| 5,424,722 A | 6/1995 | Inada et al. |
| 5,438,607 A | 8/1995 | Przygoda, Jr. et al. |
| 5,458,992 A | 10/1995 | Bailey |
| 5,458,997 A | 10/1995 | Crespi et al. |
| 5,491,038 A | 2/1996 | DePalma et al. |
| 5,494,496 A | 2/1996 | Huhndorff et al. |
| 5,514,491 A | 5/1996 | Webber |
| 5,525,439 A | 6/1996 | Huhndorff et al. |
| 5,543,246 A | 8/1996 | Treger |
| 5,569,556 A | 10/1996 | Bohmer |
| 5,587,573 A | 12/1996 | Owen et al. |
| 5,596,278 A | 1/1997 | Lin |
| 5,607,790 A | 3/1997 | Hughen et al. |
| 5,627,472 A | 5/1997 | Ofer et al. |
| 5,633,592 A | 5/1997 | Lang |
| 5,640,150 A | 6/1997 | Atwater |
| 5,654,640 A | 8/1997 | Bailey |
| 5,691,083 A | 11/1997 | Bolster |
| 5,737,114 A | 4/1998 | Bailey |
| 5,786,106 A | 7/1998 | Armani |
| 5,798,933 A | 8/1998 | Nicolai |
| 5,849,046 A | 12/1998 | Bailey |
| 5,925,479 A | 7/1999 | Wei et al. |
| 5,959,568 A | 9/1999 | Woolley |
| 5,963,012 A | 10/1999 | Garcia et al. |
| 6,014,014 A | 1/2000 | Owen et al. |
| 6,084,523 A | 7/2000 | Gelnovatch et al. |
| 6,127,062 A | 10/2000 | Sargeant et al. |
| 6,143,439 A | 11/2000 | Yoppolo et al. |
| 6,156,450 A | 12/2000 | Bailey |
| 6,169,397 B1 | 1/2001 | Steinbach et al. |
| 6,171,729 B1 | 1/2001 | Gan et al. |
| 6,208,235 B1 | 3/2001 | Trontelj |
| 6,218,054 B1 | 4/2001 | Webber |
| 6,252,377 B1 | 6/2001 | Shibutani et al. |
| 6,275,161 B1 | 8/2001 | Wan et al. |
| 6,300,004 B1 | 10/2001 | Tucholski |
| 6,407,534 B1 | 6/2002 | Mukainakano |
| 6,469,471 B1 | 10/2002 | Anbuky et al. |
| 6,483,275 B1 | 11/2002 | Nebrigic et al. |
| 6,587,250 B2 | 7/2003 | Armgarth et al. |
| 6,617,069 B1 | 9/2003 | Hopper et al. |
| 6,617,072 B2 | 9/2003 | Venkatesan et al. |
| 6,627,353 B1 | 9/2003 | Munshi |
| 6,670,073 B2 | 12/2003 | Tucholski et al. |
| RE38,518 E | 5/2004 | Tucholski |
| 6,730,136 B2 | 5/2004 | Webber |
| 6,774,685 B2 | 8/2004 | O'Toole et al. |
| 6,775,562 B1 | 8/2004 | Owens et al. |
| 6,849,360 B2 | 2/2005 | Marple |
| 6,979,502 B1 | 12/2005 | Gartstein et al. |
| 6,990,171 B2 | 1/2006 | Toth et al. |
| 7,067,882 B2 | 6/2006 | Singh |
| 7,079,079 B2 | 7/2006 | Jo et al. |
| 7,157,185 B2 | 1/2007 | Marple |
| 7,386,404 B2 | 6/2008 | Cargonja et al. |
| 7,474,230 B2 | 1/2009 | Blom et al. |
| 7,489,431 B2 | 2/2009 | Malmstrom et al. |
| 7,511,454 B1 | 3/2009 | Legg |
| 7,561,050 B2 | 7/2009 | Bhogal et al. |
| 7,576,517 B1 | 8/2009 | Cotton et al. |
| 7,586,416 B2 | 9/2009 | Ariyoshi et al. |
| 7,598,880 B2 | 10/2009 | Powell et al. |
| 7,606,530 B1 | 10/2009 | Anderson et al. |
| 7,715,884 B2 | 5/2010 | Book et al. |
| 7,741,970 B2 | 6/2010 | Cunningham et al. |
| 7,745,046 B2 | 6/2010 | Kim et al. |
| 7,768,236 B2 | 8/2010 | Takamura et al. |
| 7,772,850 B2 | 8/2010 | Bertness |
| 7,805,263 B2 | 9/2010 | Mack |
| 7,911,182 B2 | 3/2011 | Cargonja et al. |
| 7,944,368 B2 | 5/2011 | Carter et al. |
| 8,031,054 B2 | 10/2011 | Tuttle |
| 8,106,845 B2 | 1/2012 | Savry |
| 8,119,286 B2 | 2/2012 | Issaev et al. |
| 8,131,486 B2 | 3/2012 | Leonard et al. |
| 8,344,685 B2 | 1/2013 | Bertness et al. |
| 8,368,356 B2 | 2/2013 | Nakashima et al. |
| 8,374,507 B2 | 2/2013 | Hudson et al. |
| 8,424,092 B2 | 4/2013 | Ikeuchi et al. |
| 8,427,109 B2 | 4/2013 | Melichar |
| 8,471,888 B2 | 6/2013 | George et al. |
| 8,652,670 B2 | 2/2014 | Uchida |
| 8,653,926 B2 | 2/2014 | Detcheverry et al. |
| 8,900,731 B2 | 12/2014 | Bohne |
| 8,905,317 B1 | 12/2014 | Hsu et al. |
| 9,037,426 B2 | 5/2015 | Schaefer |
| 9,060,213 B2 | 6/2015 | Jones |
| 9,076,092 B2 | 7/2015 | Ritamaki et al. |
| 9,083,063 B2 | 7/2015 | Specht et al. |
| 9,146,595 B2 | 9/2015 | Forutanpour et al. |
| 9,167,317 B2 | 10/2015 | DeMar |
| 9,189,667 B2 | 11/2015 | Bourilkov et al. |
| 9,235,044 B2 | 1/2016 | Specht et al. |
| 9,297,859 B2 | 3/2016 | Mukaitani et al. |
| 9,312,575 B2 | 4/2016 | Stukenberg et al. |
| 9,331,378 B2 | 5/2016 | Merlin et al. |
| 9,425,487 B2 | 8/2016 | Bertness |
| 9,453,885 B2 | 9/2016 | Mukaitani et al. |
| 9,459,323 B2 | 10/2016 | Mukaitani et al. |
| 9,461,339 B2 | 10/2016 | Roohparvar |
| 9,478,850 B2 | 10/2016 | Bourilkov et al. |
| 9,551,758 B2 | 1/2017 | Bourilkov et al. |
| 9,568,556 B2 | 2/2017 | Bourilkov et al. |
| 9,619,612 B2 | 4/2017 | Kallfelz et al. |
| 9,639,724 B2 | 5/2017 | Bourilkov et al. |
| 9,661,576 B2 | 5/2017 | Tomisawa |
| 9,699,818 B2 | 7/2017 | Grothaus et al. |
| 9,726,763 B2 | 8/2017 | Dempsey et al. |
| 9,739,837 B2 | 8/2017 | Bourilkov et al. |
| 9,746,524 B2 | 8/2017 | Petrucelli |
| 9,774,210 B1 | 9/2017 | Wright |
| 9,823,310 B2 | 11/2017 | Bourilkov et al. |

(56) References Cited

U.S. PATENT DOCUMENTS

| | | |
|---|---|---|
| 9,841,462 B2 | 12/2017 | Kim et al. |
| 9,843,220 B2 | 12/2017 | Herrmann et al. |
| 9,869,726 B2 | 1/2018 | Zumstein et al. |
| 9,882,250 B2 | 1/2018 | Chappelle et al. |
| 9,887,463 B2 | 2/2018 | Bourilkov et al. |
| 9,893,390 B2 | 2/2018 | Specht et al. |
| 9,983,312 B2 | 5/2018 | Dempsey et al. |
| 10,094,886 B2 | 10/2018 | Bourilkov et al. |
| 10,151,802 B2 | 12/2018 | Riemer et al. |
| 10,184,988 B2 | 1/2019 | Bourilkov et al. |
| 10,297,875 B2 | 5/2019 | Riemer et al. |
| 10,416,309 B2 | 9/2019 | Dempsey et al. |
| 10,483,634 B2 | 11/2019 | Bourilkov et al. |
| 2001/0005123 A1 | 6/2001 | Jones et al. |
| 2001/0026226 A1 | 10/2001 | Andersson et al. |
| 2002/0001745 A1 | 1/2002 | Gartstein et al. |
| 2002/0086718 A1 | 7/2002 | Bigwood et al. |
| 2003/0070283 A1 | 4/2003 | Webber |
| 2003/0169047 A1 | 9/2003 | Chen |
| 2003/0170537 A1 | 9/2003 | Randell |
| 2003/0184493 A1 | 10/2003 | Robinet et al. |
| 2003/0228518 A1 | 12/2003 | Marple |
| 2004/0029007 A1 | 2/2004 | Kusumoto et al. |
| 2004/0048512 A1 | 3/2004 | Chen |
| 2004/0183742 A1 | 9/2004 | Goff et al. |
| 2005/0038614 A1 | 2/2005 | Botts et al. |
| 2005/0073282 A1 | 4/2005 | Carrier et al. |
| 2005/0095508 A1 | 5/2005 | Yamamoto |
| 2005/0112462 A1 | 5/2005 | Marple |
| 2005/0162129 A1 | 7/2005 | Mutabdzija et al. |
| 2005/0233214 A1 | 10/2005 | Marple et al. |
| 2005/0258797 A1 | 11/2005 | Hung |
| 2005/0277023 A1 | 12/2005 | Marple et al. |
| 2006/0017581 A1 | 1/2006 | Schwendinger et al. |
| 2006/0028179 A1 | 2/2006 | Yudahira et al. |
| 2006/0043933 A1 | 3/2006 | Latinis |
| 2006/0046152 A1 | 3/2006 | Webber |
| 2006/0046153 A1 | 3/2006 | Webber |
| 2006/0046154 A1 | 3/2006 | Webber et al. |
| 2006/0047576 A1 | 3/2006 | Aaltonen et al. |
| 2006/0163692 A1 | 7/2006 | Detecheverry et al. |
| 2006/0168802 A1 | 8/2006 | Tuttle |
| 2006/0170397 A1 | 8/2006 | Srinivasan et al. |
| 2006/0208898 A1 | 9/2006 | Swanson et al. |
| 2006/0247156 A1 | 11/2006 | Vanderby et al. |
| 2006/0261960 A1 | 11/2006 | Haraguchi et al. |
| 2007/0080804 A1 | 4/2007 | Hirahara et al. |
| 2007/0096697 A1 | 5/2007 | Maireanu |
| 2007/0108946 A1 | 5/2007 | Yamauchi et al. |
| 2007/0182576 A1 | 8/2007 | Proska et al. |
| 2007/0210924 A1 | 9/2007 | Arnold et al. |
| 2007/0273329 A1 | 11/2007 | Kobuse et al. |
| 2008/0053716 A1 | 3/2008 | Scheucher |
| 2008/0076029 A1 | 3/2008 | Bowden et al. |
| 2008/0079391 A1 | 4/2008 | Schroeck et al. |
| 2008/0157924 A1 | 7/2008 | Batra |
| 2008/0160392 A1 | 7/2008 | Toya et al. |
| 2008/0206627 A1 | 8/2008 | Wright |
| 2008/0218351 A1 | 9/2008 | Corrado et al. |
| 2008/0252462 A1 | 10/2008 | Sakama |
| 2009/0008031 A1 | 1/2009 | Gould et al. |
| 2009/0009177 A1 | 1/2009 | Kim et al. |
| 2009/0024309 A1 | 1/2009 | Crucs |
| 2009/0041228 A1 | 2/2009 | Owens et al. |
| 2009/0098462 A1 | 4/2009 | Fujiwara et al. |
| 2009/0148756 A1 | 6/2009 | Specht et al. |
| 2009/0155673 A1 | 6/2009 | Northcott |
| 2009/0179763 A1 | 7/2009 | Sheng |
| 2009/0214950 A1 | 8/2009 | Bowden et al. |
| 2009/0263727 A1 | 10/2009 | Josephs et al. |
| 2009/0273473 A1 | 11/2009 | Tuttle |
| 2009/0289825 A1 | 11/2009 | Trinkle |
| 2009/0297949 A1 | 12/2009 | Berkowitz et al. |
| 2009/0308936 A1 | 12/2009 | Nitzan et al. |
| 2010/0019733 A1 | 1/2010 | Rubio |
| 2010/0030592 A1 | 2/2010 | Evans et al. |
| 2010/0073003 A1 | 3/2010 | Sakurai et al. |
| 2010/0081049 A1 | 4/2010 | Holl et al. |
| 2010/0085008 A1 | 4/2010 | Suzuki et al. |
| 2010/0087241 A1 | 4/2010 | Nguyen et al. |
| 2010/0143753 A1 | 6/2010 | Kim et al. |
| 2010/0209744 A1 | 8/2010 | Kim |
| 2010/0219252 A1 | 9/2010 | Kikuchi et al. |
| 2010/0261045 A1* | 10/2010 | Wu .......... H01R 11/287 429/98 |
| 2010/0295943 A1 | 11/2010 | Cha et al. |
| 2010/0308974 A1 | 12/2010 | Rowland et al. |
| 2011/0018777 A1 | 1/2011 | Brown |
| 2011/0023130 A1 | 1/2011 | Gudgel et al. |
| 2011/0104520 A1 | 5/2011 | Ahn |
| 2011/0123874 A1 | 5/2011 | Issaev et al. |
| 2011/0163752 A1 | 7/2011 | Janousek et al. |
| 2011/0293969 A1 | 12/2011 | Hoofman et al. |
| 2012/0021266 A1 | 1/2012 | Marple et al. |
| 2012/0056002 A1 | 3/2012 | Ritamaki et al. |
| 2012/0081774 A1 | 4/2012 | De Paiva Martins et al. |
| 2012/0086615 A1 | 4/2012 | Norair |
| 2012/0121943 A1 | 5/2012 | Roohparvar |
| 2012/0183862 A1 | 7/2012 | Gupta et al. |
| 2012/0190305 A1 | 7/2012 | Wuidart |
| 2012/0206102 A1 | 8/2012 | Okamura et al. |
| 2012/0206302 A1 | 8/2012 | Ramachandran et al. |
| 2012/0217971 A1 | 8/2012 | Deluca |
| 2012/0235870 A1 | 9/2012 | Forster |
| 2012/0277832 A1 | 11/2012 | Hussain |
| 2012/0299597 A1 | 11/2012 | Shigemizu |
| 2012/0323511 A1 | 12/2012 | Saigo et al. |
| 2013/0069768 A1* | 3/2013 | Madhyastha .......... G08C 19/12 340/12.5 |
| 2013/0117595 A1 | 5/2013 | Murawski et al. |
| 2013/0127611 A1 | 5/2013 | Bernstein et al. |
| 2013/0148283 A1 | 6/2013 | Forutanpour et al. |
| 2013/0154652 A1 | 6/2013 | Rice et al. |
| 2013/0161380 A1 | 6/2013 | Joyce et al. |
| 2013/0162402 A1 | 6/2013 | Amann et al. |
| 2013/0162403 A1 | 6/2013 | Striemer et al. |
| 2013/0162404 A1 | 6/2013 | Striemer et al. |
| 2013/0164567 A1 | 6/2013 | Olsson et al. |
| 2013/0171479 A1 | 7/2013 | Kim et al. |
| 2013/0183568 A1 | 7/2013 | Babinec et al. |
| 2013/0185008 A1 | 7/2013 | Itabashi et al. |
| 2013/0271072 A1 | 10/2013 | Lee et al. |
| 2013/0295421 A1* | 11/2013 | Teramoto .......... H01M 10/02 429/61 |
| 2013/0320989 A1 | 12/2013 | Inoue et al. |
| 2014/0062663 A1 | 3/2014 | Bourilkov et al. |
| 2014/0139380 A1 | 5/2014 | Ouyang et al. |
| 2014/0188413 A1 | 7/2014 | Bourilkov et al. |
| 2014/0197802 A1* | 7/2014 | Yamazaki .......... H01M 10/44 320/137 |
| 2014/0229129 A1 | 8/2014 | Campbell et al. |
| 2014/0302348 A1 | 10/2014 | Specht et al. |
| 2014/0302351 A1 | 10/2014 | Specht et al. |
| 2014/0320144 A1 | 10/2014 | Nakaya |
| 2014/0342193 A1 | 11/2014 | Mull et al. |
| 2014/0346873 A1 | 11/2014 | Colangelo et al. |
| 2014/0347249 A1 | 11/2014 | Bourilkov et al. |
| 2014/0370344 A1* | 12/2014 | Lovelace .......... H01M 2/344 429/90 |
| 2014/0379285 A1 | 12/2014 | Dempsey et al. |
| 2015/0061603 A1 | 3/2015 | Loftus et al. |
| 2015/0064524 A1 | 3/2015 | Noh et al. |
| 2015/0162649 A1* | 6/2015 | Bae .......... H01M 10/484 429/91 |
| 2015/0349391 A1* | 12/2015 | Chappelle .......... H02J 7/0029 429/7 |
| 2015/0357685 A1 | 12/2015 | Iwasawa et al. |
| 2016/0034733 A1 | 2/2016 | Bourilkov et al. |
| 2016/0049695 A1 | 2/2016 | Lim et al. |
| 2016/0056444 A1* | 2/2016 | Hwang .......... H02J 7/0029 429/7 |
| 2016/0064781 A1 | 3/2016 | Specht et al. |
| 2016/0092847 A1 | 3/2016 | Buchbinder |

(56) References Cited

U.S. PATENT DOCUMENTS

| | | |
|---|---|---|
| 2016/0137088 A1 | 5/2016 | Lim et al. |
| 2016/0154025 A1 | 6/2016 | Song et al. |
| 2016/0277879 A1 | 9/2016 | Daoura et al. |
| 2017/0040698 A1 | 2/2017 | Bourilkov et al. |
| 2017/0062841 A1* | 3/2017 | Riemer ............... H01M 10/488 |
| 2017/0062880 A1* | 3/2017 | Riemer ................ H01M 10/48 |
| 2017/0092994 A1 | 3/2017 | Canfield et al. |
| 2017/0125855 A1 | 5/2017 | Gong et al. |
| 2017/0176539 A1 | 6/2017 | Younger |
| 2017/0286918 A1 | 10/2017 | Westermann et al. |
| 2017/0301961 A1 | 10/2017 | Kim et al. |
| 2017/0315183 A1 | 11/2017 | Chao et al. |
| 2017/0331162 A1 | 11/2017 | Clarke et al. |
| 2018/0040929 A1 | 2/2018 | Chappelle et al. |
| 2018/0088182 A1 | 3/2018 | Bourilkov et al. |
| 2018/0120386 A1* | 5/2018 | Riemer ................ G01R 31/371 |
| 2018/0123174 A1 | 5/2018 | Riemer et al. |
| 2018/0123175 A1 | 5/2018 | Riemer et al. |
| 2018/0123233 A1 | 5/2018 | Bourilkov et al. |
| 2018/0159225 A1 | 6/2018 | Bourilkov et al. |
| 2019/0113579 A1 | 4/2019 | Riemer et al. |
| 2019/0137572 A1 | 5/2019 | Bourilkov et al. |
| 2020/0011997 A1 | 1/2020 | Dempsey et al. |

FOREIGN PATENT DOCUMENTS

| | | |
|---|---|---|
| CN | 1228540 A | 9/1999 |
| CN | 1315072 A | 9/2001 |
| CN | 1529182 A | 9/2004 |
| CN | 2828963 Y | 10/2006 |
| CN | 101126795 A | 2/2008 |
| CN | 201142022 Y | 10/2008 |
| CN | 201233435 Y | 5/2009 |
| CN | 101702792 A | 5/2010 |
| CN | 101785164 A | 7/2010 |
| CN | 102097844 A | 6/2011 |
| CN | 102142186 A | 8/2011 |
| CN | 102544709 A | 7/2012 |
| CN | 202308203 U | 7/2012 |
| CN | 202720320 U | 2/2013 |
| CN | 202856390 U | 4/2013 |
| CN | 103682482 A | 3/2014 |
| CN | 104635169 A | 5/2015 |
| CN | 105337367 A | 2/2016 |
| CN | 205160145 U | 4/2016 |
| CN | 106405241 A | 2/2017 |
| CN | 106848448 A | 6/2017 |
| CN | 107284272 A | 10/2017 |
| CN | 206804833 U | 12/2017 |
| DE | 10118027 A1 | 11/2002 |
| DE | 10118051 A1 | 11/2002 |
| EP | 0523901 A1 | 1/1993 |
| EP | 1450174 A1 | 8/2004 |
| EP | 1693807 A1 | 8/2006 |
| EP | 1786057 A2 | 5/2007 |
| EP | 1821363 A1 | 8/2007 |
| EP | 2065962 A1 | 6/2009 |
| EP | 2204873 A1 | 7/2010 |
| EP | 2324535 A1 | 5/2011 |
| EP | 2328223 A1 | 6/2011 |
| EP | 2645447 A1 | 10/2013 |
| EP | 2680093 A2 | 1/2014 |
| EP | 2790262 A1 | 10/2014 |
| EP | 3128599 A1 | 2/2017 |
| JP | S52005581 A | 1/1977 |
| JP | 61169781 | 7/1986 |
| JP | 02142324 | 5/1990 |
| JP | H03131771 A | 6/1991 |
| JP | H06284170 A | 10/1994 |
| JP | H09005366 A | 1/1997 |
| JP | 10014003 | 1/1998 |
| JP | 2000077928 A | 3/2000 |
| JP | 2001022905 A | 1/2001 |
| JP | 2004085580 A | 3/2004 |
| JP | 2004-253858 A | 9/2004 |
| JP | 2004534430 A | 11/2004 |
| JP | 2005327099 A | 11/2005 |
| JP | 2006139544 A | 6/2006 |
| JP | 2006284431 A | 10/2006 |
| JP | 2006324074 A | 11/2006 |
| JP | 2007515848 A | 6/2007 |
| JP | 2007171045 A | 7/2007 |
| JP | 2008042985 A | 2/2008 |
| JP | 2008-530682 A | 8/2008 |
| JP | 2008181855 A | 8/2008 |
| JP | 2009-37374 | 2/2009 |
| JP | 2010098361 A | 4/2010 |
| JP | 2010-154012 A | 7/2010 |
| JP | 2011113759 A | 6/2011 |
| JP | 2011203595 A | 10/2011 |
| JP | 2012/0056002 A | 3/2012 |
| JP | 2012085491 A | 4/2012 |
| JP | 2012-129183 A | 7/2012 |
| JP | 2012161614 A | 8/2012 |
| JP | 2012170262 A | 9/2012 |
| JP | 2013-038967 A | 2/2013 |
| JP | 2013038961 A | 2/2013 |
| JP | 2013120640 A | 6/2013 |
| KR | 2011-0018488 A | 2/2011 |
| TW | M510009 U | 10/2015 |
| TW | I580153 B | 4/2017 |
| WO | WO-95/01062 A1 | 1/1995 |
| WO | WO-03/047064 A2 | 6/2003 |
| WO | WO-2004/047215 A1 | 6/2004 |
| WO | WO-2004/107251 A2 | 12/2004 |
| WO | WO-2005/078673 A1 | 8/2005 |
| WO | WO-2006/048838 A1 | 5/2006 |
| WO | WO-2006/085291 A2 | 8/2006 |
| WO | WO-2008/151181 A1 | 12/2008 |
| WO | WO-2008/156735 A1 | 12/2008 |
| WO | WO-2010/127509 A1 | 11/2010 |
| WO | WO-2011/063679 A1 | 6/2011 |
| WO | WO-2011/096863 A1 | 8/2011 |
| WO | WO-2012/051272 A2 | 4/2012 |
| WO | WO-2012/061262 A1 | 5/2012 |
| WO | WO-2012/070635 A1 | 5/2012 |
| WO | WO-2012/083759 A1 | 6/2012 |
| WO | WO-2013/022857 A2 | 2/2013 |
| WO | WO-2013/024341 A1 | 2/2013 |
| WO | WO-2013/069423 A1 | 5/2013 |
| WO | WO-2013/084481 A1 | 6/2013 |
| WO | WO-2013/101652 A1 | 7/2013 |
| WO | WO-2015/183609 A1 | 12/2015 |
| WO | WO-2016/146006 A1 | 9/2016 |
| WO | WO-2016/166735 A1 | 10/2016 |
| WO | WO-2016/172542 A1 | 10/2016 |

OTHER PUBLICATIONS

International Application No. PCT/US2017/059469, International Search Report and Written Opinion, dated Jan. 18, 2018.

Atmel Corporation, Application Note AVR400: Low Cost A/D Converter, available at http://www.atmel.com/images/doc0942.pfd (last visited Oct. 24, 2013).

International Application No. PCT/US2017/059469, Written Opinion of the International Preliminary Examining Authority, dated Dec. 5, 2018.

Yamashiro, Voltage Detecting Circuit, Japanese Patent No. 52005581, Hitashi Ltd., (Jan. 17, 1977), Translated by the United States Patent and Trademark Office via Phoenix Translations (Elgin, TX) in Feb. 2018.

Kooser, Tethercell magically turns AA batteries into Bluetooth devices, CNET.com, downloaded from the Internet at: <https://www.cnet.com/news/tethercell-magically-turns-aa-batteries-into-bluetooth-devices/> (Jan. 8, 2013).

Tethercell Smart Battery Adapter fundraising campaign on Indiegogo website (<https://www.indiegogo.com/projects/tethercell-smart-battery-adapter#/>) (launched Oct. 2013).

Tethercell video uploaded at <https://vimeo.com/53823785> (Oct. 2012).

U.S. Appl. No. 15/340,731, "Single Sided Reusable Battery Indicator", filed Nov. 1, 2016.

(56) References Cited

OTHER PUBLICATIONS

U.S. Appl. No. 15/340,737, "Positive Battery Terminal Antenna Ground Plane", filed Nov. 1, 2016.
U.S. Appl. No. 15/340,757, "Dual Sided Reusable Battery Indicator", filed Nov. 1, 2016.
U.S. Appl. No. 15/340,789, "Reusable Battery Indicator with Electrical Lock and Key", filed Nov. 1, 2016.
European Patent Application No. 17804720.5, Communication under Rule 71(3) EPC, dated Mar. 20, 2020.

* cited by examiner

REUSABLE BATTERY INDICATOR WITH LOCK AND KEY MECHANISM

FIELD OF THE INVENTION

The disclosure relates generally to battery indicators and, more specifically, relates to a reusable battery characteristic indicator with a mechanical lock and key mechanism.

BACKGROUND OF THE INVENTION

Electrochemical cells, or batteries, are commonly used as electrical energy sources. A battery contains a negative electrode, typically called the anode, and a positive electrode, typically called the cathode. The anode contains an electrochemically active anode material that can be oxidized. The cathode contains an electrochemically active cathode material that can be reduced. The electrochemically active anode material is capable of reducing the electrochemically active cathode material. A separator is disposed between the anode and the cathode. The battery components are disposed in a can, or housing, that is typically made from metal.

When a battery is used as an electrical energy source in an electronic device, electrical contact is made to the anode and the cathode, thereby completing a circuit that allows electrons to flow through the device, and which results in respective oxidation and reduction reactions that produce electrical power to the electronic device. An electrolyte is in contact with the anode, the cathode, and the separator. The electrolyte contains ions that flow through the separator between the anode and cathode to maintain charge balance throughout the battery during discharge.

There is a growing need for portable power for electronic devices such as toys; remote controls; audio devices; flashlights; digital cameras and peripheral photography equipment; electronic games; toothbrushes; radios; clocks, and other portable electronic devices. Consumers need to have power readily available for these electronic devices. Because batteries necessarily become depleted of power over time as they are used, consumers need to have access to spare batteries (and/or access to fully recharged rechargeable batteries). It is helpful for a consumer to know the power state of a battery currently in use so that the consumer can have quick access to the needed number of replacement batteries. Batteries come in common sizes, such as the AA, AAA, AAAA, C, and D battery sizes, that have fixed external dimensions and constrained internal volumes per ANSI standard.

Currently, some batteries include on-cell battery charge indicators to help a consumer determine when a battery is nearly depleted and in need of replacement. However, these current on-cell battery charge indicators are single use (i.e., attached to a single battery cell) and cumbersome (because typically two contact buttons must be simultaneously depressed to activate the indicator). Additionally, these on-cell battery indicators require removal of the battery from an electronic device (or package) in order to use the indicator.

SUMMARY OF THE INVENTION

According to some aspects, a reusable battery indicator comprises a voltage sensor configured to convert sensed analog characteristics of a battery to digital information; a communication circuit communicatively connected to the voltage sensor; an antenna operatively coupled to the communication circuit; and a connection mechanism having at least a first connector and a second connector that are electrically connected to the voltage sensor. The first connector and the second connector are adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal. One or more of the first connector and the second connector includes part of a mechanical lock and key assembly.

According to another aspect, a remote battery indication system comprises a battery; and a reusable battery indicator, the battery indicator including a voltage sensor, a communication circuit communicatively connected to the voltage sensor, an antenna operatively coupled to the communication circuit, and a connection mechanism having at least a first connector and a second connector that are electrically connected to the voltage sensor. The first connector and the second connector are adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal. The first connector and the second connector are electrically attached to a first battery terminal and a second battery terminal, respectively, so that the voltage sensor senses a characteristic of the battery. One or more of the first connector and the second connector includes part of a mechanical lock and key assembly.

In accordance with the teachings of the disclosure, any one or more of the foregoing aspects of a reusable battery indicator or a remote battery indication system may further include any one or more of the following optional forms.

In some optional forms a voltage booster may be electrically connected to or incorporated in the voltage sensor.

In other preferred forms, the first connector has a first mechanical lock and key assembly and the second connector has a second mechanical lock and key assembly.

In yet other preferred forms, the first connector includes a male connection of the mechanical lock and key assembly and the first battery terminal includes a female connection of the mechanical lock and key assembly.

In yet other preferred forms the male connection is a triangular key.

In yet other preferred forms the female connection is a triangular recess.

In other preferred forms, at least one of the first connector and the second connector comprises at least one of a magnet, a cup, a sleeve, a tab, a socket, a pin, a washer, a spring connector, or any combination thereof.

In yet other preferred forms, at least one of the first connector and the second connector comprises at least one metal and at least one insulator.

In yet other preferred forms, at least one of the first connector and the second connector comprises at least one of a metal, a metal alloy, cold-rolled steel, carbon, or any combination thereof.

In yet other preferred forms, the communication circuit may comprise at least one of radio-frequency identification circuitry, Bluetooth® circuitry, Bluetooth® low energy circuitry, Wi-Fi circuitry, Zigbee® circuitry, LORA circuitry, and Z-wave circuitry.

In yet other preferred forms, the voltage sensor is capable of reading an open circuit voltage of less than 1.8 Volts.

In yet other preferred forms, the voltage sensor and the communication circuit are formed on a printed circuit board that is adapted to be inserted between the first connector and the second connector.

In yet other preferred forms, the first connector and the second connector may comprise flexible wires with conductive magnets.

In yet other preferred forms, the voltage sensor and the communication circuit are mounted within a housing, and the housing is sized and shaped to fit between two cylindrical batteries that are arranged longitudinally side-by-side.

In yet other preferred forms, the housing has a cross-section that is in the shape of a triangular prism.

In yet other preferred forms, the housing has one side that is concave or two sides that are concave.

In yet other preferred forms, the voltage sensor is disc-shaped and the voltage sensor is arranged to fit one end of a cylindrical battery cell.

In yet other preferred forms, the voltage sensor is one of a thin disc BLE, UHF, or RF module.

In yet other preferred forms, a housing of the reusable battery indicator is mounted within a battery receptacle of an electronic device.

In yet other preferred forms, a computing device is communicatively connected to the communication circuit, and the computing device receives information from the communication circuit through the antenna.

In yet other preferred forms, the computing device includes a processor and a memory, the memory storing a software routine that causes the processor to detect a wireless communication signal from the reusable battery indicator, to remotely control battery circuitry through the reusable battery indicator to determine battery characteristic data; and to send the battery characteristic data to a user interface.

In yet other preferred forms, the battery characteristic data comprises at least one of an electrical capacity, a voltage, an impedance, a temperature, a current, an age, a charge/discharge cycle count, and a coulomb count.

In yet other preferred forms, the software routine, when executed by the processor, causes the processor to determine at least one of a battery type, a physical location of the battery, and an electrical device that the battery is powering.

BRIEF DESCRIPTION OF THE DRAWINGS

While the specification concludes with claims particularly pointing out and distinctly claiming the subject matter, which is regarded as forming the present invention, the invention will be better understood from the following description taken in conjunction with the accompanying drawings.

DETAILED DESCRIPTION OF THE INVENTION

Electrochemical cells, or batteries, may be primary or secondary. Primary batteries are meant to be discharged, e.g., to exhaustion, only once and then discarded. Primary batteries (or disposable batteries) are described, for example, in David Linden, *Handbook of Batteries* (4$^{th}$ ed. 2011). Secondary batteries (or rechargeable batteries) are intended to be recharged and used over and over again. Secondary batteries may be discharged and recharged many times, e.g., more than fifty times, a hundred times, or more. Secondary batteries are described, for example, in David Linden, *Handbook of Batteries* (4$^{th}$ ed. 2011). Accordingly, batteries may include various electrochemical couples and electrolyte combinations. Although the description and examples provided herein are generally directed towards primary alkaline electrochemical cells, or batteries, it should be appreciated that the invention applies to both primary and secondary batteries of aqueous, nonaqueous, ionic liquid, and solid state systems. For example, in addition to being a primary battery such as a primary alkaline battery, the battery may be a primary lithium-ion battery. Alternatively, the battery can be a secondary battery, for example, a secondary battery such as a nickel metal hydride (NiMH) battery, a nickel cadmium (NiCad) battery, a silver/zinc battery, a nickel/zinc battery, or a lithium solid state rechargeable battery. Primary and secondary batteries of the aforementioned systems are thus within the scope of this application and the invention is not limited to any particular embodiment.

Figure 1:
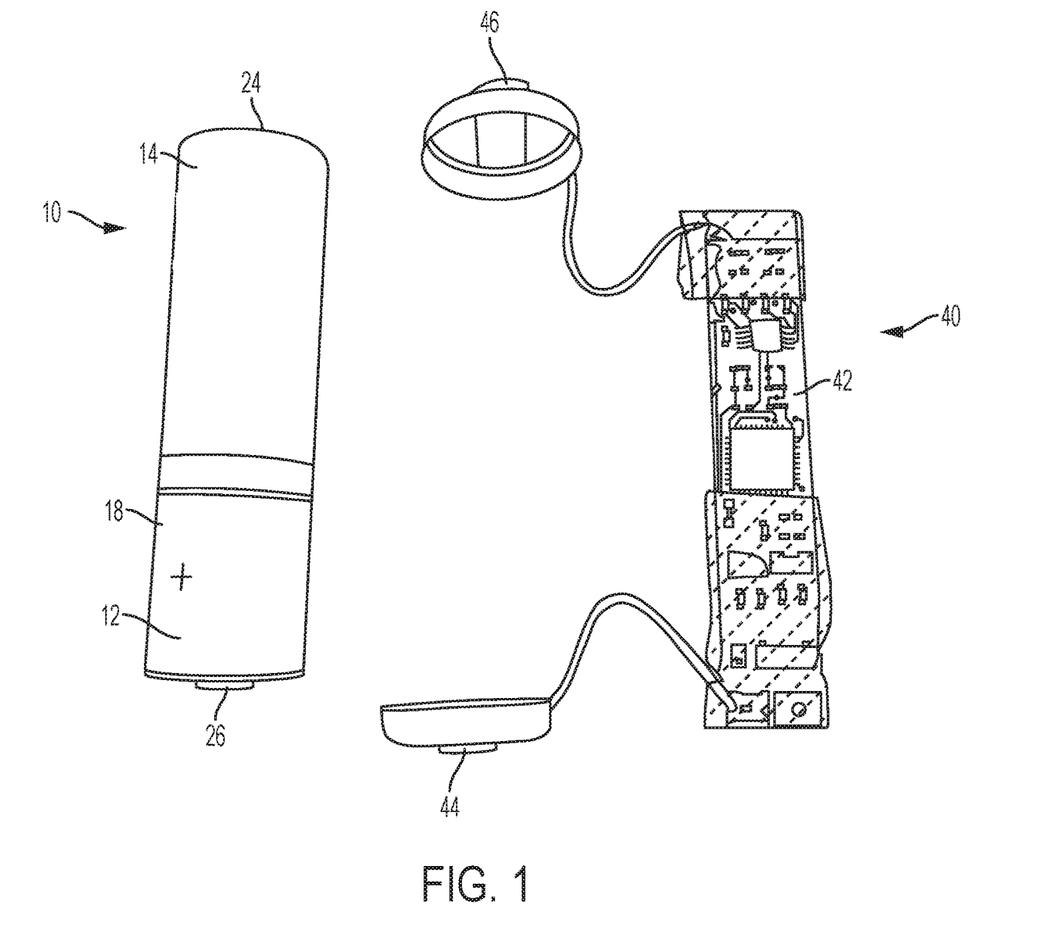
FIG. 1 is a top plan view of a battery cell and a reusable battery indicator constructed in accordance with the teachings of the disclosure, the battery cell and the reusable battery indicator being separated from one another.
Figure 2:
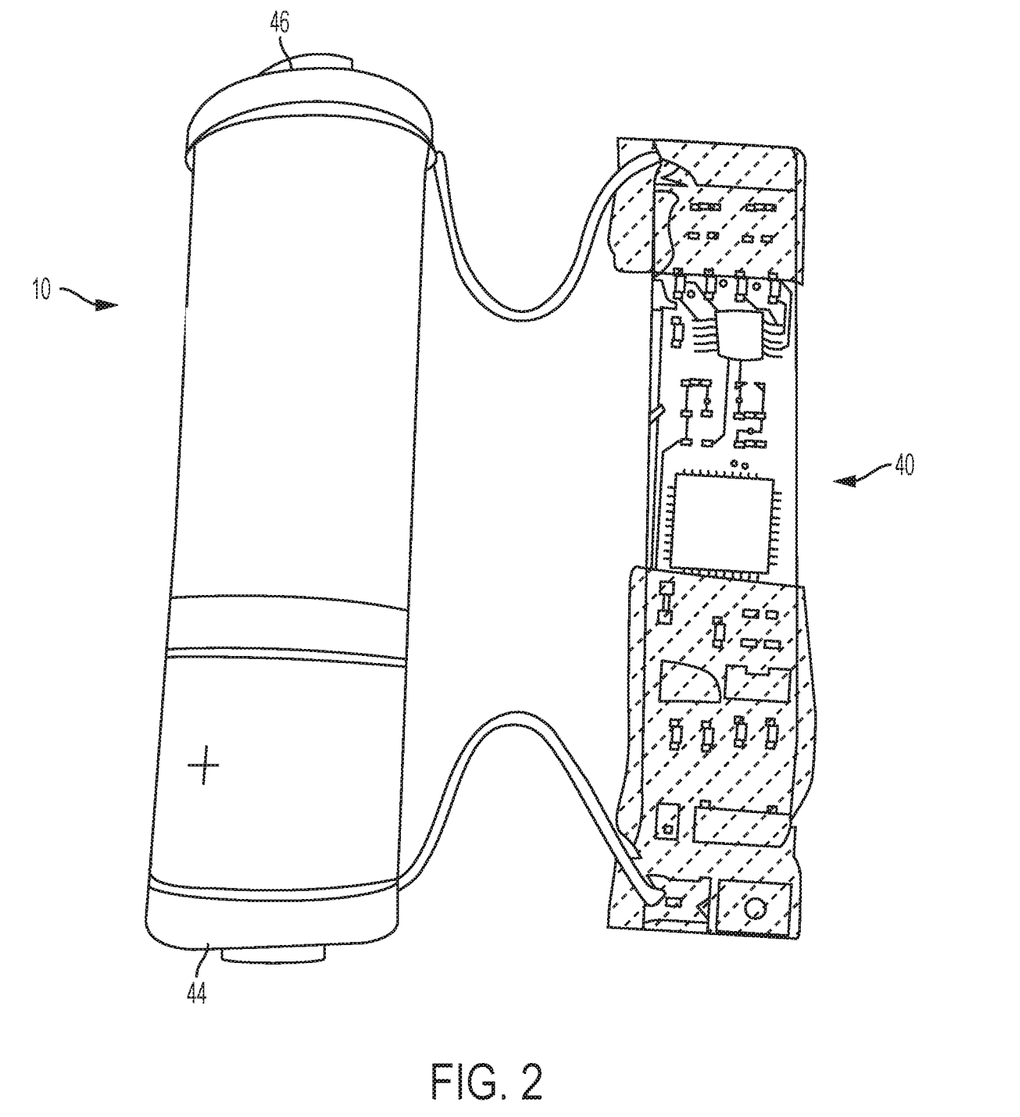
FIG. 2 is a top plan view of the reusable battery indicator of FIG. 1 connected to the battery cell.

Referring to FIGS. 1 and 2, a primary alkaline electrochemical cell, or battery cell 10, is illustrated that includes a cathode 12, an anode 14, and a housing 18. The battery cell 10 also includes an end cap 24. The end cap 24 serves as a negative terminal of the battery cell 10. A positive pip 26 is located at the opposite end of the battery cell 10 from the end cap 24. The positive pip 26 serves as a positive terminal of the battery cell 10. An electrolytic solution is dispersed throughout the battery cell 10. The battery cell 10 can be, for example, a AA, AAA, AAAA, C, or D alkaline battery. Additionally, in other embodiments, the battery cell 10 can be a 9V battery, a camera battery, a watch battery, or any other type of primary or secondary battery.

The housing 18 can be made of any suitable type of housing base material, for example cold-rolled steel or nickel-plated cold-rolled steel. In the embodiment illustrated in FIG. 1, the housing 18 may have a cylindrical shape. In other embodiments, the housing 18 may have any other suitable, non-cylindrical shape. The housing 18, for example, may have a shape comprising at least two parallel plates, such as a rectangular, square, or prismatic shape. The housing 18 may be, for example, deep-drawn from a sheet of the base material, such as cold-rolled steel or nickel-plated steel. The housing 18 may be, for example, drawn into a cylindrical shape. The housing 18 may have a sidewall. The interior surface of the sidewall of the housing 18 may be treated with a material that provides a low electrical-contact resistance between the interior surface of the sidewall of the housing 18 and an electrode, such as the cathode 12. The interior surface of the sidewall of the housing 18 may be plated, e.g., with nickel, cobalt, and/or painted with a carbon-loaded paint to decrease contact resistance between, for example, the internal surface of the sidewall of the housing 18 and the cathode 12.

Next to the battery cell 10 is one embodiment of a communication mechanism, such as a reusable battery indicator 40. The reusable battery indicator 40 includes an integrated circuit, which may be incorporated into a printed circuit board (PCB) 42, a first connector 44 that is electrically connected to the PCB 42, and a second connector 46 that is electrically connected to the PCB 42. The first connector 44 may be removably and electrically connected to the positive pip 26 to form a positive electrical connection and the second connector 46 may be removably and electrically connected to the end cap 24 to form a negative electrical connection, as illustrated in FIG. 2. The first connector 44 and the second connector 46 may take virtually any physical form that allows the first connector 44 and the second connector 46 to form electrical connections with the battery cell 10 and the PCB 42. In some embodiments, the first connector 44 and the second connector 46 may take any one or more of the following forms, a magnet, a cup, a sleeve, a tab, a socket, a pin, a washer, a spring connector, a wire loop, or any combination thereof. Moreover, the first connector 44 and the second connector 46 may be formed from virtually any material that transmits analog information, such as electrical information, from the battery cell to the PCB 42. For example, in some embodiments, the first connector 44 and the second connector 46 may be formed from one or more of the following materials, a metal, a metal alloy, cold-rolled steel, hard drawn ferrous and non-ferrous alloys, high and low carbon steel alloys, post or pre-plated ferrous and non-ferrous alloys, or any combination thereof. In some embodiments, at least one of the first connector 44 and the second connector 46 may comprise a metal and an insulator. For example, in some embodiments, the inner surface of the first connector 44 and/or of the second connector 46 may include a non-conductive coating (such as a polymer layer, epoxy or passivate) or an additional insulator ring (paper, phenolic or polymer) to guard against shorting to the battery housing or crimp.

Generally, the integrated circuit receives electrical information, such as amperes or volts from the first connector 44 and from the second connector 46, and the electrical information is used by the integrated circuit to calculate battery characteristic information, such as power or charge level, and the integrated circuit then transmits the battery characteristic information to a receiver, such as a computer, a smart phone, or a personal digital assistant, for use by the consumer. In this way, the reusable battery indicator 40 allows a consumer to acquire the battery characteristic information without removing the battery cell from an electronic device (or from a package). The first connector 44 and the second connector 46 deliver the electrical information to the integrated circuit without interfering with electrical contacts between the battery cell and the electronic device. Furthermore, the reusable battery indicator 40 is movable from one battery cell to another battery cell so as to be reused over and over again, thereby reducing the overall cost to a consumer.

Figure 3:
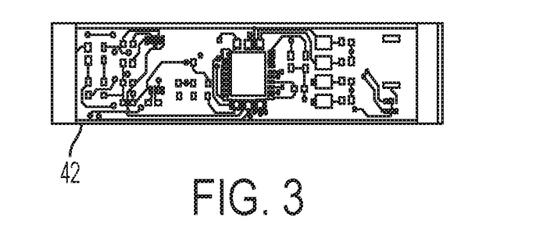
FIG. 3 is a close-up plan view of a printed circuit board of the reusable battery indicator of FIG. 1.
Figure 4:
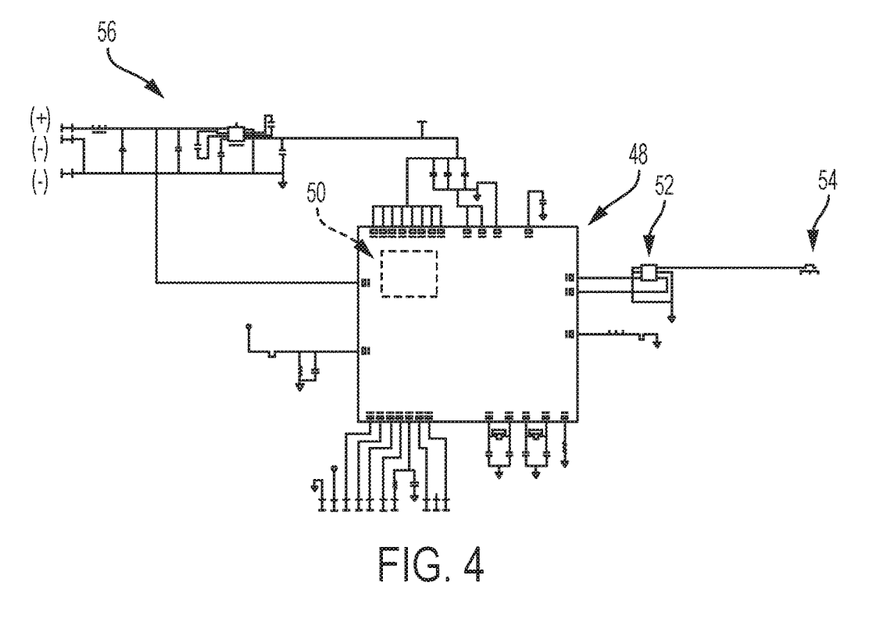
FIG. 4 is an electronic circuit schematic diagram of the reusable battery indicator of FIG. 1.

Turning now to FIGS. 3 and 4, formed on the PCB 42 is an integrated circuit 48, that includes an embedded voltage sensor 50 within the integrated circuit 48 that is communicatively connected to the first connector 44 and to the second connector 46. The embedded voltage sensor 50 senses analog characteristics of the battery cell, such as amperes and voltage and converts the sensed analog characteristics to digital information. The PCB 42 also includes a communication circuit 52. An antenna 54 is operatively coupled to the communication circuit 52. The communication circuit 52 may comprise one or more of a radio-frequency identification circuit, a Bluetooth® circuit, a Bluetooth® low energy circuit, a Wi-Fi circuit, a Zigbee® circuit, a LORA circuit, and a Z-wave circuit. In one embodiment, an integrated circuit, such as a wireless Bluetooth Low-Energy voltage sensor, may incorporate the analog to digital converter, a microcontroller, a Bluetooth radio, a memory device, and a DC/DC voltage converter.

A voltage booster 56 is electrically connected to the integrated circuit 48 and the embedded voltage sensor 50. The embedded voltage sensor 50 and the voltage booster 56 are capable of reading the open circuit voltage of the battery that may be, for example, less than 1.8 volts. In some embodiments, the communication circuit 52 may comprise one or more of a thin disc BLE module, a UHF module, or a RF module.

In the embodiment illustrated in FIGS. 3 and 4, the integrated circuit 48, the voltage sensor 50, and the communication circuit 52 are all formed on the PCB 42, which is connected to the first connector 44 and the second connector 46. However, in other embodiments, the integrated circuit 48, the voltage sensor 50, and the communication circuit 52 may be formed as separate components that are communicatively and operatively connected to one another.

Figures 5A, 5B:
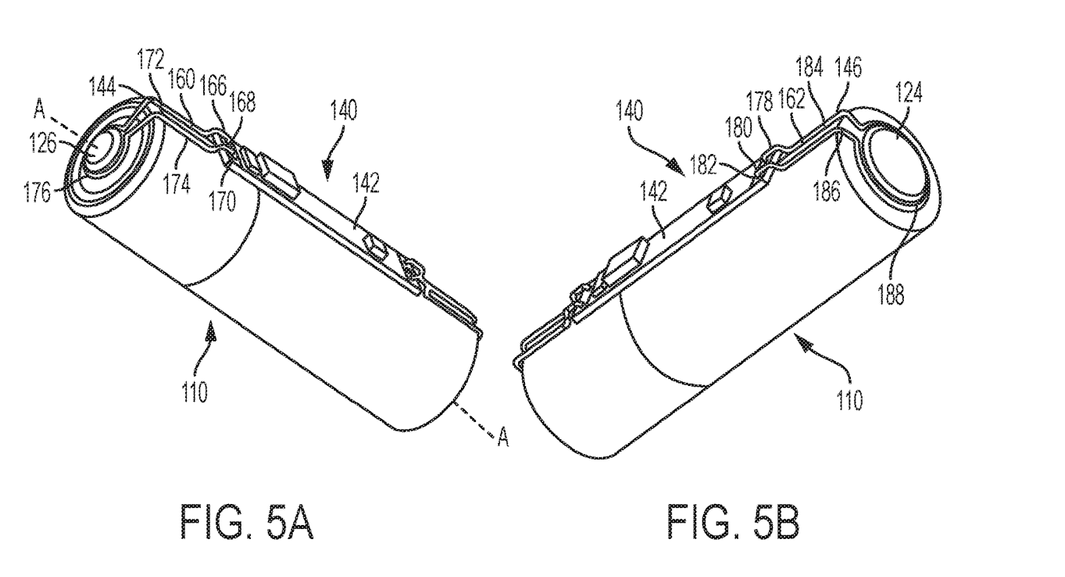
FIGS. 5A and 5B are top and bottom perspective views, respectively, of a second embodiment of a reusable battery indicator that is connected to a battery cell.

In the embodiment illustrated in FIGS. 5A and 5B, similar elements are numbered exactly 100 greater than elements numbered in FIGS. 1-4. For example, the battery cell is numbered 10 in FIGS. 1-4 and the battery cell is numbered 110 in FIGS. 5A and 5B. Unless stated otherwise, any element from any illustrated embodiment may be incorporated into any other illustrated embodiment.

Turning now to FIGS. 5A and 5B, a second embodiment of the reusable battery indicator 140 is attached to a battery cell 110. The reusable battery indicator 140 includes a PCB 142, a first connector 144, and a second connector 146. While the battery cell 110 in FIGS. 5A and 5B is illustrated as a AA size battery, the illustration is not intended to limit the reusable battery indicator 140 to the illustrated battery cell 110. Rather, the reusable battery indicator 140 may be sized and shaped to fit virtually any battery cell, especially those battery cell sizes listed elsewhere in the specification.

In the embodiment illustrated in FIGS. 5A and 5B, the first connector 144 and the second connector 146 comprise flexible wires 160, 162, respectively. The flexible wires 160, 162 may be formed as spring wires (from hard drawn ferrous and non-ferrous spring alloys) that capture the positive battery terminal 126 and the negative battery terminal 124, respectively, to transmit electrical characteristics, such as voltage and amperes, to the integrated circuit formed on the PCB 142. In one embodiment, the spring wires may be formed of ASTM A228 music wire with re or post nickel plating to enhance conductivity, to reduce contact resistance, and to provide corrosion resistance.

In the embodiment illustrated in FIGS. 5A and 5B, the flexible wire 160 includes a first end 166, which is connected to a positive terminal 168 on the PCB 142 and a second end 170, which is also connected to the positive terminal 168 on the PCB 142. Other embodiments may include single ended wires. The flexible wire 160 includes a first leg 172, extending from the first end 166 and a second leg 174 extending from the second end 170. The first leg 172 and the second leg 174 are oriented substantially parallel to a longitudinal axis A of the battery cell 110. The first leg 172 and the second leg 174 are connected to one another at an end loop 176. The end loop 176 lies in a plane that is substantially perpendicular to the longitudinal axis of the battery cell 110. The end loop 176 is sized and shaped to fit around the positive terminal 126 of the battery cell 110. As a result, the flexible wire 160 forms a positive electrical pathway from the positive battery terminal 126 to the positive terminal 168 on the PCB 142. Moreover, the flexible wire 160 may be formed to produce a spring force that biases the flexible wire 160 into the attached position illustrated in FIGS. 5A and 5B, while allowing the flexible wire 160 to be temporarily deformed by a user to remove the reusable battery indicator 140 from the battery cell 110 when desired.

Similar to the flexible wire 160, the flexible wire 162 includes a first end 178, which is connected to a negative terminal 180 on the PCB 142 and a second end 182, which is also connected to the negative terminal 180 on the PCB 142. The flexible wire 162 includes a first leg 184, extending from the first end 178 and a second leg 186 extending from the second end 182. The first leg 184 and the second leg 186 are oriented substantially parallel to the longitudinal axis A of the battery cell 110. The first leg 184 and the second leg 186 are connected to one another at an end loop 188. The end loop 188 lies in a plane that is substantially perpendicular to the longitudinal axis of the battery cell 110. The end loop 186 is sized and shaped to fit around the negative terminal 124 of the battery cell 110. As a result, the flexible wire 162 forms a negative electrical pathway from the negative battery terminal 124 to the negative terminal 180 on the PCB 142. Moreover, the flexible wire 162 may be formed to produce a spring force that biases the flexible wire 162 into the attached position illustrated in FIGS. 5A and 5B, while allowing the flexible wire 162 to be temporarily deformed by a user to remove the reusable battery indicator 140 from the battery cell 110 when desired.

The approximately 90° bends (which may be greater than 90° in other embodiments to mate with a tapered positive terminal) between the first and second legs 172, 174 of the first flexible wire 160 and the end loop 176 and between the first and second legs 184, 186 of the second flexible wire 162 and the end loop 188, create an axial force, which maintains the reusable battery indicator 140 in electrical connection with the battery cell 110.

In some embodiments, one or more of the first flexible wire 160 and the second flexible wire 162 may include a conductive magnet, or the one or more of the first flexible wire 160 and the second flexible wire 162 may be formed from conductive magnetic material, to provide additional retention force between the first flexible wire 160 and the positive terminal 126 and between the second flexible wire 162 and the negative terminal 124.

In other embodiments, one or more of the first flexible wire 160 and the second flexible wire 162 may be formed as a Kelvin connection, including separate power and sensing terminals, to measure impedance. Additionally, in alternate embodiments, the first flexible wire 160 and the second flexible wire 162 need not be formed as a single continuous wire, but may be formed as multiple wire pieces, for example, two wire pieces that are separated by a small distance in the end loop.

Figure 6A:
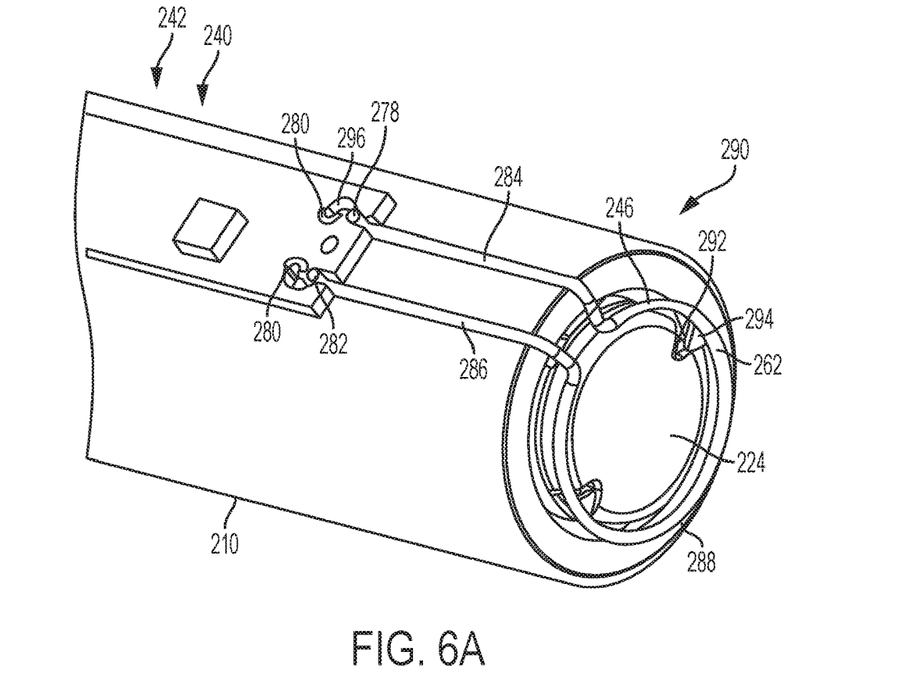
FIG. 6A is a bottom perspective view of a third embodiment of a reusable battery indicator that includes a mechanical lock and key assembly in an unlocked position.
Figure 6B:
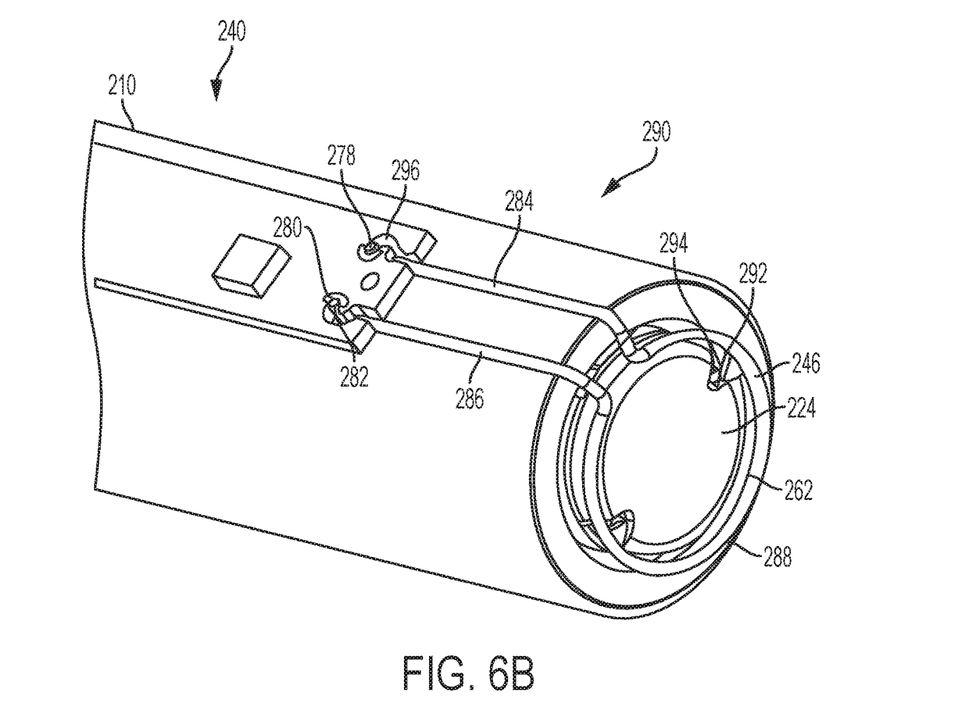
FIG. 6B is a bottom perspective view of the third embodiment of FIG. 6A with the mechanical lock and key assembly in a locked position.

Turning now to FIGS. 6A and 6B, a third embodiment of a reusable battery indicator 240 is illustrated that includes a mechanical lock and key assembly 290. Unless stated otherwise, any element from any illustrated embodiment may be incorporated into any other illustrated embodiment.

Like the earlier embodiment, the reusable battery indicator 240 of FIGS. 6A and 6B includes a PCB 242, a first connector (not illustrated in FIGS. 6A and 6B), and a second connector 246. While the battery cell 210 in FIGS. 6A and 6B is illustrated as a AA size battery, the illustration is not intended to limit the reusable battery indicator 240 to the illustrated battery cell 210. Rather, the reusable battery indicator 240 may be sized and shaped to fit virtually any battery cell, especially those battery cell sizes listed elsewhere in the specification.

In the embodiment illustrated in FIGS. 6A and 5B, the first connector and the second connector 246 comprise flexible wires, such as flexible wire 262. The flexible wire 262 may be formed as a spring wire that captures the negative battery terminal 224 to transmit electrical characteristics, such as voltage and amperes, to the integrated circuit formed on the PCB 242. Similarly, the flexible wire forming the first connector may be formed as a spring wire that captures the positive terminal to transmit electrical characteristics to the integrated circuit.

In the embodiment illustrated in FIGS. 6A and 6B, the flexible wire 262 includes a first end 278, which is connected to a negative terminal 280 on the PCB 242 and a second end 282, which is also connected to a negative terminal 280 on the PCB 242. The flexible wire 262 includes a first leg 284, extending from the first end 278 and a second leg 286 extending from the second end 282. The first leg 284 and the second leg 286 are oriented substantially parallel to the longitudinal axis of the battery cell 210. The first leg 284 and the second leg 286 are connected to one another at an end loop 288. The end loop 288 lies in a plane that is substantially perpendicular to the longitudinal axis of the battery cell 210. The end loop 288 is sized and shaped to fit around the negative battery terminal 224. As a result, the flexible wire 262 forms a negative electrical pathway from the negative battery terminal 224 to the negative terminal 280 on the PCB 242. The flexible wire forming the first connector may include similar or identical features.

The mechanical lock and key assembly 290 includes the end loop 288; a lock feature, such as a depression 292 on the negative terminal 224; a key feature, such as a protrusion 294 on the end loop 288; and one or more locking channels 296 formed in the PCB 242. In the embodiment illustrated in FIGS. 6A and 6B, the lock feature is a triangular-shaped depression 292 and the key feature is a triangular-shaped protrusion 294. In other embodiments, the lock feature and the key feature may have other complementary-shapes. In yet other embodiments, the male-female relationship may be reversed.

The first and second ends 278, 282 of the flexible wire 262 are slidable within the locking channels 296. In the unlocked position, which is illustrated in FIG. 6A, the first and second ends 278, 282 are positioned away from the negative terminal 280. As a result, the flexible wire 262 is extended away from the PCB 242. More specifically, the end loop 288 is extended away from the PCB 242, which extends the overall length of the reusable battery indicator 240 to facilitate attachment of the reusable battery indicator 240 to the battery cell 210.

Once the reusable battery indicator 240 is positioned on the battery cell 210, and the key feature 294 is aligned with the lock feature 292, the end loop 288 is pushed towards the PCB 242, which seats the key feature 294 within the lock feature 292, and which moves the first and second ends 278, 282 of the flexible wire 262 into contact with the negative terminal 280, as illustrated in FIG. 6B. The mechanical lock and key assembly 290 thus mechanically secures the reusable battery indicator 240 to the battery cell 210 at one end (i.e., at the negative battery terminal 224) while completing a negative electrical circuit between the negative terminal 280 of the PCB and the negative battery terminal 224 through the flexible wire 262. The mechanical lock and key assembly 290 prevents the reusable battery indicator 240 from being used on an incorrect battery type (i.e., one that lacks the mechanical lock feature on the negative terminal).

While the mechanical lock and key assembly 290 has been described herein as being located on the negative side of the reusable battery indicator 240, the mechanical lock and key assembly 290 could also be located on the positive side of the reusable battery indicator 240 or both the positive and negative sides of the reusable battery indicator 240 could include mechanical lock and key assemblies 290 in other embodiments.

Figure 7:
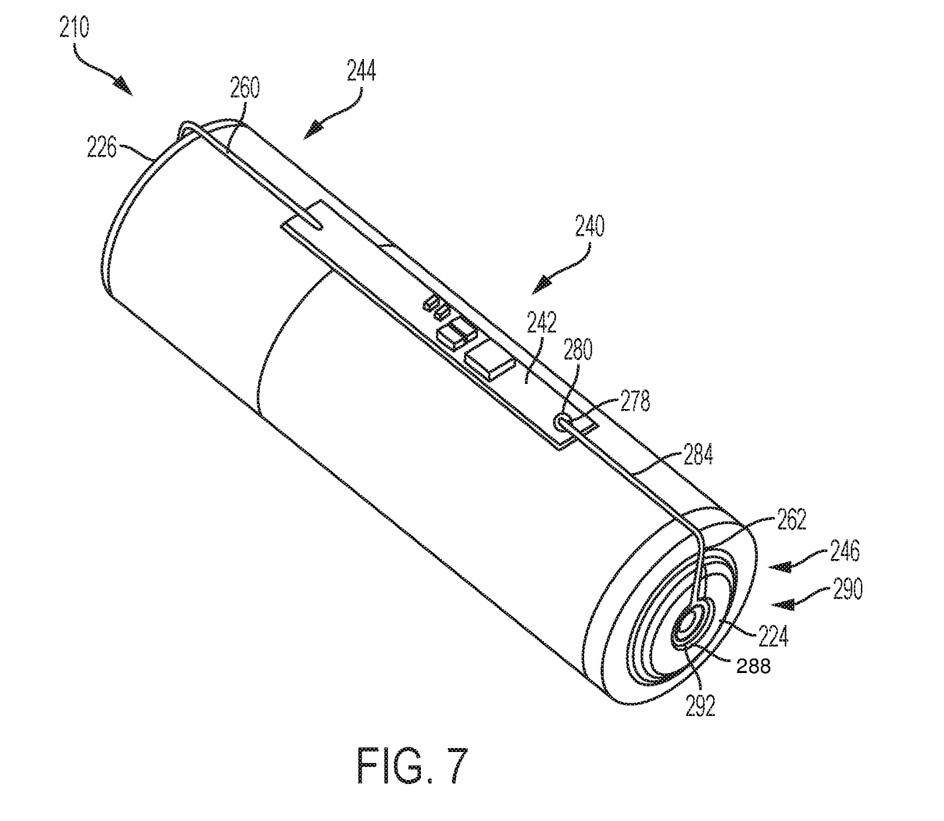
FIG. 7 is a bottom perspective view of a fourth embodiment of a reusable battery indicator that includes a mechanical lock and key assembly in a locked position.

Turning now to FIG. 7, a fourth embodiment of a reusable battery indicator 240 is illustrated that includes a mechanical lock and key assembly 290. Unless stated otherwise, any element from any illustrated embodiment may be incorporated into any other illustrated embodiment. In the embodiment of FIG. 7, like elements have the same reference numerals as the embodiment of FIGS. 6A and 6B for ease of reference, there being only small differences between the two embodiments.

Like the earlier embodiments, the reusable battery indicator 240 of FIG. 7 includes a PCB 242, a first connector 244, and a second connector 246. While the battery cell 210 in FIG. 7 is illustrated as a AA size battery, the illustration is not intended to limit the reusable battery indicator 240 to the illustrated battery cell 210. Rather, the reusable battery indicator 240 may be sized and shaped to fit virtually any battery cell, especially those battery cell sizes listed elsewhere in the specification.

In the embodiment illustrated in FIG. 7, the first connector 244 and the second connector 246 comprise flexible wires, such as flexible wires 260 and 262, respectively. The flexible wires 260, 262 may be formed as a spring wires that capture the positive battery terminal 226 and the negative battery terminal 224, respectively, to transmit electrical characteristics, such as voltage and amperes, to the integrated circuit formed on the PCB 242.

Further description of the embodiment illustrated in FIG. 7 will be directed to the negative terminal 224 and to the second connector 246. However, the structural features described with respect to the negative terminal 224 and with respect to the second connector 246 apply equally to the positive terminal 226 and to the first connector 244. However, further discussion of such structural features on the positive terminal 226 and on the first connector 244 is omitted in the interest of brevity.

The flexible wire 262 includes a first end 278, which is connected to a negative terminal 280 on the PCB 242. The flexible wire 262 includes a single leg 284, extending from the first end 278. The single leg 284 is oriented substantially parallel to the longitudinal axis of the battery cell 210. The single leg 284 forms an end loop 288 opposite the first end 278. The end loop 288 lies in a plane that is substantially perpendicular to the longitudinal axis of the battery cell 210.

The end loop 288 is sized and shaped to fit within a recess in the negative battery terminal 224. As a result, the flexible wire 262 forms a negative electrical pathway from the negative battery terminal 224 to the negative terminal 280 on the PCB 242. The flexible wire forming the first connector may include similar or identical features.

A mechanical lock and key assembly 290 includes the end loop 288, which forms a key feature; and a lock feature, such as the recess 292 on the negative terminal 224. In the embodiment illustrated in FIG. 7, the lock feature is the circular-shaped recess 292 and the key feature is the circular-shaped end loop 288. In other embodiments, the lock feature and the key feature may have other complementary-shapes. In yet other embodiments, the male-female relationship may be reversed.

Once the reusable battery indicator 240 is positioned on the battery cell 210, and the end loop 288 is aligned with the recess 292, the end loop 288 is pushed towards the PCB 242, which seats the end loop 288 within the recess 292. The mechanical lock and key assembly 290 thus mechanically secures the reusable battery indicator 240 to the battery cell 210 at one end (i.e., at the negative battery terminal 224) while completing a negative electrical circuit between the negative terminal 280 of the PCB and the negative battery terminal 224 through the flexible wire 262 at the other end. The mechanical lock and key assembly 290 prevents the reusable battery indicator 240 from being used on an incorrect battery type (i.e., one that lacks the mechanical lock feature on the negative terminal).

While the mechanical lock and key assembly 290 has been described herein as being located on the negative side of the reusable battery indicator 240, the mechanical lock and key assembly 290 could also be located on the positive side of the reusable battery indicator 240 or both the positive and negative sides of the reusable battery indicator 240 could include mechanical lock and key assemblies 290 in other embodiments.

The mechanical lock and key assemblies described herein advantageously stabilize the reusable battery indicator when installed on a battery. More specifically, the mechanical lock and key assemblies prevent the reusable battery indicator from shifting during device use, thereby maintaining positive electrical contact and preventing accidental dislodgement of the reusable battery indicator from the battery.

Figure 8:
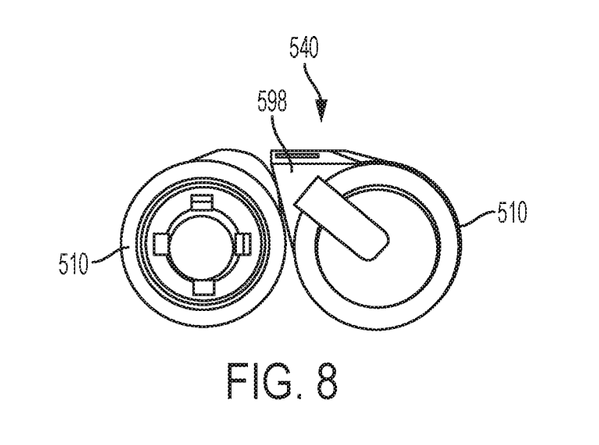
FIG. 8 is an end view of a fifth embodiment of a reusable battery indicator that is attached to one cell of a pair of battery cells.

Turning now to FIG. 8, a fifth embodiment of a reusable battery indicator 540 is illustrated and located between two battery cells 510. In the embodiment of FIG. 8, the reusable battery indicator 540 includes a housing 598 that has only a single concave side.

Figure 9:
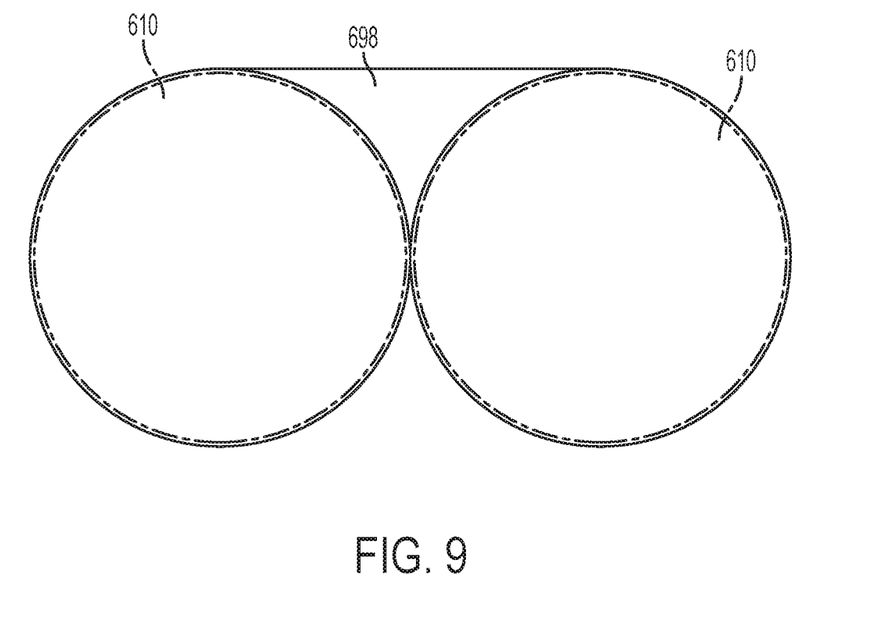
FIG. 9 is a diagram of a sixth embodiment of a reusable battery indicator that is located between two adjacent battery cells.

FIG. 9 illustrates an alternative housing shape. In this embodiment, the housing 698 is arranged to fit in the void formed by two cylindrical battery cells 610 that are arranged side by side and oriented such that the respective longitudinal axes of the battery cells 610 are parallel to one another. In the embodiment illustrated in FIG. 9, the housing 698 has a cross-sectional shape that is defined by the following equation:

$$A_v = (D_B^2 - \Pi/4 \times D_B^2)/2, \text{ where}$$

$A_v$ is the cross-sectional area of the housing 698; and
$D_B$ is a diameter of one battery cell 610.

A housing having a cross-sectional shape defined by the preceding equation maximizes the usable space between the battery cells. For example, a housing having the cross-sectional shape defined above would result in the following housing volumes for the given battery sizes (assuming that the housing length was equal to the battery cell length). For a AAA battery, the housing would have a volume of 526 mm³; and for a AA battery, the housing would have a volume of 1140 mm³. In other embodiments, the housing may have another cross-sectional shapes (e.g., rectangular, trapezoidal, elliptical, semi-circular, and variable prisms that fit into the area between the battery cells as described above).

Figure 10:
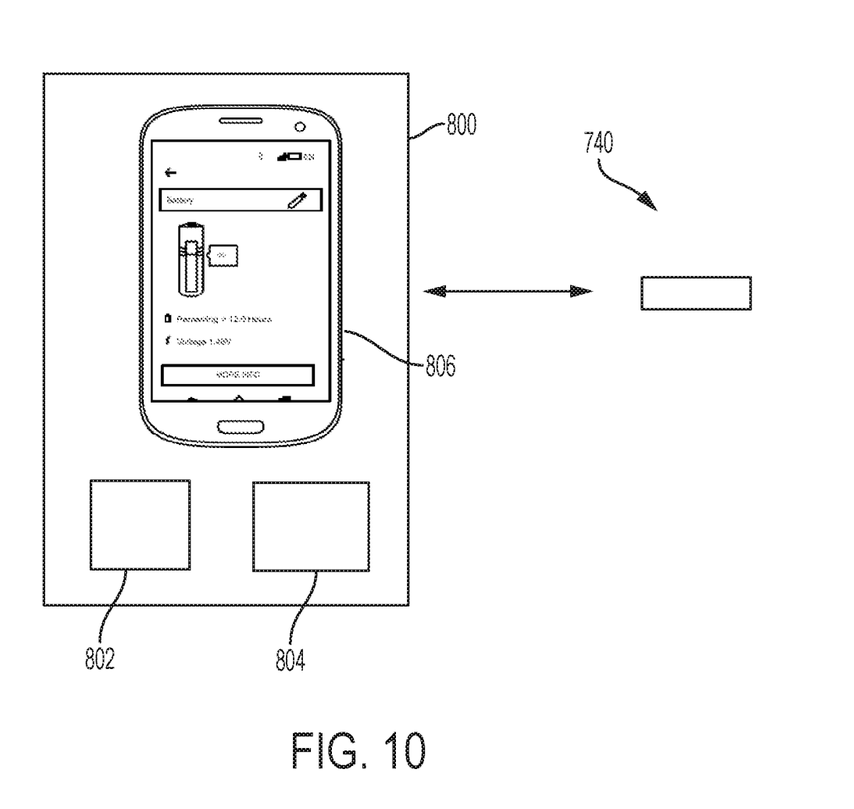
FIG. 10 is a schematic diagram of a battery indication system including the reusable battery indicator of FIG. 1.

Turning now to FIG. 10, a computing device 800 is communicatively connected to the communication circuit in the reusable battery indicator 740. The computing device receives information from the communication circuit through wireless signals sent by the antenna in the reusable battery indicator 740. For example, the wireless signal may be one or more of a wifi signal, a Bluetooth® signal, a RFID signal, or any other wireless signal. In other embodiments, the computing device 800 and the reusable battery indicator 740 may communicatively connected by a wired connection.

The computing device 800 includes a processor 802 and a memory 804. The memory 804 may store processor executable instructions that, when executed by the processor 802, cause the processor 802 to detect a wireless communication signal from the reusable battery indicator 740. In some embodiments the memory 804 may comprise a non-transitory computer readable medium with the processor executable instructions embedded thereon as an article of manufacture. The processor executable instructions may also cause the processor 802 to send wireless signals back to the reusable battery indicator 740 to remotely control battery circuitry through the reusable battery indicator 740. In this manner, the processor 802 may cause the reusable battery indicator 740 to determine battery characteristic data; and to send the battery characteristic data to a user interface, such as a display 806 on the computing device 800.

In some embodiments, the battery characteristic data may comprise at least one of an electrical capacity; a voltage; an impedance, a temperature, a current; an age, a charge/discharge cycle count, and a coulomb count.

In other embodiments, the processor executable instructions, when executed by the processor 802, causes the processor 802 to determine at least one of a battery type, a physical location of the battery, and an electrical device that the battery is powering by communicating with the reusable battery indicator 740.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A reusable battery indicator comprising:
   a voltage sensor configured to convert sensed analog characteristics of a battery to digital information;
   a communication circuit communicatively connected to the voltage sensor;
   an antenna operatively coupled to the communication circuit; and
   a connection mechanism having a first connector and a second connector that are electrically connected to the voltage sensor, the first connector and the second connector being adapted to be removably connected to a first battery terminal and to a second battery terminal, respectively, thereby providing an electrical connection between the voltage sensor and the first and second battery terminals,
   wherein at least one of the first connector and the second connector includes a part of a mechanical lock and key assembly with at least one of the first battery terminal and the second battery terminal.

2. The reusable battery indicator of claim 1, wherein the first connector has a first mechanical lock and key assembly and the second connector has a second mechanical lock and key assembly.

3. The reusable battery indicator of claim 1, wherein the first connector includes a male connection of the mechanical lock and key assembly and the first battery terminal includes a female connection of the mechanical lock and key assembly.

4. The reusable battery indicator of claim 3, wherein the male connection is a triangular key.

5. The reusable battery indicator of claim 3, wherein the female connection is a triangular recess.

6. The reusable battery indicator of claim 1, further comprising a voltage booster electrically connected to or incorporated in the voltage sensor.

7. The reusable battery indicator of claim 1, wherein at least one of the first connector and the second connector comprises at least one of a metal, a metal alloy, cold-rolled steel, carbon, or any combination thereof.

8. The reusable battery indicator of claim 1, wherein the communication circuit comprises at least one of radio-frequency identification circuitry, Bluetooth circuitry, Bluetooth low energy circuitry, Wi-Fi circuitry, Zigbee circuitry, LORA circuitry, and Z-wave circuitry.

9. The reusable battery indicator of claim 1, wherein the voltage sensor is capable of reading an open circuit voltage of less than 1.8 Volts.

10. The reusable battery indicator of claim 1, wherein the voltage sensor and the communication circuit are formed on a double sided printed circuit board that is adapted to be inserted between the first connector and the second connector.

11. The reusable battery indicator of claim 1, further comprising a housing, the voltage sensor and the communication circuit being mounted within the housing, the housing being sized and shaped to fit between two cylindrical batteries that are arranged side-by-side.

12. The reusable battery indicator of claim 11, wherein the housing has a cross-section that is in the shape of a triangular prism.

13. The reusable battery indicator of claim 12, wherein the housing has one side that is concave.

14. The reusable battery indicator of claim 1, wherein the mechanical lock and key assembly includes a curved channel with an electrical contact being formed at one end of the curved channel.

15. The reusable battery indicator of claim 1, wherein the voltage sensor is one of a thin disc BLE, UHF, or RF module.

16. An electrical device comprising the reusable battery indicator of claim 1, wherein the reusable battery indicator is mounted within a battery receptacle of the electronic device.

17. The reusable battery indicator of claim 1, wherein the mechanical lock and key assembly both completes an electrical circuit between a PCB and a battery terminal and simultaneously prevents the reusable battery indicator from being used on an incorrect battery type.

18. A remote battery indication system, the system comprising:
a computing device;
a battery; and
a reusable battery indicator, the battery indicator including a voltage sensor configured to convert sensed analog characteristics of a battery to digital information; a communication circuit communicatively connected to the voltage sensor; an antenna operatively coupled to the communication circuit; and a connection mechanism having a first connector and a second connector that are electrically connected to the voltage sensor, the first connector and the second connector being adapted to be removably connected to a first battery terminal and to a second battery terminal, respectively, thereby providing an electrical connection between the voltage sensor and the first and second battery terminals,
wherein at least one of the first connector and the second connector includes a part of a mechanical lock and key connection with at least one of the first battery terminal and the second battery terminal.

19. The system of claim 18, wherein the computing device includes a processor and a memory, the memory storing a software routine that causes the processor to detect a wireless communication signal from the reusable battery indicator; to remotely control battery circuitry through the reusable battery indicator to determine battery characteristic data; and to send the battery characteristic data to a user interface.

20. The system of claim 19, wherein the battery characteristic data comprises at least one of an electrical capacity; a voltage; an impedance, a temperature, a current; an age, a charge/discharge cycle count, and a coulomb count.

21. The system of claim 19, wherein the software routine, when executed by the processor, causes the processor to determine at least one of a battery type, a physical location of the battery, and an electrical device that the battery is powering.

22. A combination reusable battery indicator and battery cell comprising:
a reusable battery indicator including a voltage sensor configured to convert sensed analog characteristics of a battery to digital information; a communication circuit communicatively connected to the voltage sensor; an antenna operatively coupled to the communication circuit; and a connection mechanism having a first connector and a second connector that are electrically connected to the voltage sensor, the first connector and the second connector being adapted to be removably connected to a first battery terminal and to a second battery terminal, respectively, thereby providing an electrical connection between the voltage sensor and the first and second battery terminals, wherein at least one of the first connector and the second connector includes a part of a mechanical lock and key assembly with at least one of the first battery terminal and the second battery terminal; and
a battery cell including another part of a mechanical lock and key assembly located on an outer surface thereof.

23. The combination of claim 22, wherein the part of the mechanical lock and key assembly on the battery includes a recess and the part of the mechanical lock and key assembly on the reusable battery indicator includes a protrusion.

24. The combination of claim 23, wherein the recess and the protrusion are complementary in shape and size.

25. The combination of claim 23, wherein the recess is triangular-shaped and the protrusion is triangular-shaped.

26. The combination of claim 23, wherein the recess is annular in shape and the protrusion is annular in shape.

27. A battery with a mechanical lock portion of a mechanical lock and key assembly, the battery comprising:
a housing, the housing having a recess located in an outer surface, the recess being configured to accept a corresponding key on a battery indicator.

28. The battery of claim 27, wherein the recess is located in a battery terminal.

29. The battery of claim 27, wherein the recess is triangular-shaped.

30. The battery of claim 27, wherein the recess is annular in shape.

* * * * *